(12) United States Patent
Wade et al.

(10) Patent No.: US 8,230,743 B2
(45) Date of Patent: Jul. 31, 2012

(54) PRESSURE SENSOR

(75) Inventors: Richard Wade, Worthington, OH (US);
Ian Bentley, Ipswich, NH (US)

(73) Assignee: Honeywell International Inc.,
Morristown, NJ (US)

( * ) Notice: Subject to any disclaimer, the term of this patent is extended or adjusted under 35 U.S.C. 154(b) by 158 days.

(21) Appl. No.: 12/861,318

(22) Filed: Aug. 23, 2010

(65) Prior Publication Data

US 2012/0042734 A1    Feb. 23, 2012

(51) Int. Cl.
*G01L 7/00* (2006.01)
*G01L 9/06* (2006.01)

(52) U.S. Cl. .............................. 73/706; 73/721; 73/727

(58) Field of Classification Search ............. 73/700–756
See application file for complete search history.

(56) References Cited

U.S. PATENT DOCUMENTS

| | | | |
|---|---|---|---|
| 4,658,651 A | 4/1987 | Le | |
| 4,823,605 A | 4/1989 | Stein | |
| 4,942,383 A | 7/1990 | Lam et al. | |
| 4,990,462 A | 2/1991 | Silwa, Jr. | |
| 5,086,777 A | 2/1992 | Hishii | |
| 5,225,373 A | 7/1993 | Takahashi et al. | |
| 5,257,547 A | 11/1993 | Boyer | |
| 5,327,785 A | 7/1994 | Maurer | |
| 5,410,916 A | 5/1995 | Cook | |
| 5,438,877 A | 8/1995 | Vowles et al. | |
| 5,465,626 A * | 11/1995 | Brown et al. | 73/715 |
| 5,644,285 A | 7/1997 | Maurer | |
| 5,691,480 A | 11/1997 | Cook, Sr. et al. | |
| 6,025,252 A | 2/2000 | Shindo et al. | |
| 6,058,782 A | 5/2000 | Kurtz et al. | |
| 6,143,673 A | 11/2000 | Jang et al. | |
| 6,148,673 A | 11/2000 | Brown | |
| 6,209,398 B1 | 4/2001 | Fowler, Jr. et al. | |

(Continued)

FOREIGN PATENT DOCUMENTS

EP    0659910    6/1995

(Continued)

OTHER PUBLICATIONS

U.S. Appl. No. 12/616,623, filed Nov. 29, 2009.

(Continued)

*Primary Examiner* — Andre Allen
(74) *Attorney, Agent, or Firm* — Seager Tufte & Wickhem LLC

(57) ABSTRACT

A pressure sensor is disclosed that can help isolate the sensor and/or sensor components from a media to be sensed and/or can help reduce sensor damage caused by harsh operating environments. In one illustrative embodiment, the pressure sensor may include a substrate having a pressure sensing die mounted on a first side of the substrate, a first housing member defining a first cavity around the pressure sensing die, and a second housing member defining a second cavity on the second side of the substrate. A passivating agent, such as a gel, can be positioned in both the first cavity and the second cavity to transmit pressure from the media to a pressure sensing element (e.g. diaphragm) while isolating the pressure sensing element and other components from the media. In some cases, the first housing member and/or the second housing member may include an opening for exposing the passivating agent to the media. The opening may be defined by one or more tapered and/or chamfered edges to help provide freeze damage protection.

21 Claims, 11 Drawing Sheets

U.S. PATENT DOCUMENTS

| | | | |
|---|---|---|---|
| 6,350,630 B1 | 2/2002 | Wildgen | |
| 6,401,545 B1* | 6/2002 | Monk et al. | 73/756 |
| 6,577,224 B2 | 6/2003 | Kurtz | |
| 6,612,178 B1* | 9/2003 | Kurtz et al. | 73/715 |
| 6,691,581 B2 | 2/2004 | Kurtz et al. | |
| 6,732,588 B1 | 5/2004 | Mullenborn et al. | |
| 6,756,248 B2 | 6/2004 | Ikeda et al. | |
| 6,756,316 B1 | 6/2004 | Bothra et al. | |
| 6,979,872 B2 | 12/2005 | Borwick, III et al. | |
| 7,162,927 B1 | 1/2007 | Selvan et al. | |
| 7,231,827 B2 | 6/2007 | Kumpfmuller | |
| 7,243,552 B2 | 7/2007 | Vas et al. | |
| 7,252,007 B2 | 8/2007 | Ruohio et al. | |
| 7,290,453 B2 | 11/2007 | Brosh | |
| 7,343,080 B2 | 3/2008 | Gally et al. | |
| 7,400,042 B2 | 7/2008 | Eriksen et al. | |
| 7,430,918 B2 | 10/2008 | Selvan et al. | |
| 7,434,474 B1 | 10/2008 | DuPuis | |
| 7,462,831 B2 | 12/2008 | Gooch et al. | |
| 7,478,562 B2 | 1/2009 | Kurtz et al. | |
| 7,538,401 B2 | 5/2009 | Eriksen et al. | |
| 7,571,651 B2 | 8/2009 | Kim et al. | |
| 7,622,782 B2 | 11/2009 | Chu et al. | |
| 7,624,632 B1 | 12/2009 | Hoyle et al. | |
| 7,644,625 B2* | 1/2010 | Ricks | 73/756 |
| 7,654,155 B2 | 2/2010 | Johansen et al. | |
| 7,659,610 B2 | 2/2010 | Chen et al. | |
| 7,677,109 B2 | 3/2010 | Bentley et al. | |
| 7,740,273 B2 | 6/2010 | Breed | |
| 7,810,394 B2 | 10/2010 | Yazdi | |
| 7,826,267 B2 | 11/2010 | Frayer et al. | |
| 2005/0120798 A1* | 6/2005 | James | 73/715 |
| 2007/0238215 A1 | 10/2007 | Stewart et al. | |
| 2007/0279845 A1 | 12/2007 | Kuhnt et al. | |
| 2008/0290494 A1 | 11/2008 | Lutz et al. | |
| 2009/0288484 A1 | 11/2009 | Selvan et al. | |
| 2009/0288492 A1* | 11/2009 | Stewart et al. | 73/716 |
| 2010/0013165 A1 | 1/2010 | Speldrich et al. | |
| 2010/0122583 A1 | 5/2010 | Rozgo et al. | |
| 2010/0199777 A1* | 8/2010 | Hooper et al. | 73/721 |
| 2010/0242628 A1 | 9/2010 | Knobloch et al. | |
| 2010/0271735 A1 | 10/2010 | Schreiber | |
| 2010/0281993 A1* | 11/2010 | Lo et al. | 73/724 |
| 2010/0281994 A1* | 11/2010 | Brown et al. | 73/729.1 |
| 2011/0005326 A1 | 1/2011 | Bentley et al. | |
| 2011/0036174 A1* | 2/2011 | Hooper et al. | 73/721 |

FOREIGN PATENT DOCUMENTS

| | | |
|---|---|---|
| EP | 0312532 | 9/1995 |
| EP | 2184594 | 5/2010 |
| JP | 09092670 | 4/1997 |
| JP | 20030130743 | 5/2003 |
| WO | 8602446 | 4/1986 |
| WO | 2008036701 | 3/2008 |
| WO | 2008036705 | 3/2008 |

OTHER PUBLICATIONS

Honeywell, "Installation Instructions for the Compensated and Calibrated Pressure Sensors, XCXL, XCX Series," 2 pages, 2003.

Honeywell News Release, "Honeywell Introduces Silicon Pressure Sensors That Are the Most Stable Devices Available in the Industry Today, New TruStability Sensors, the HSC and SSC Series, are Designed to Optimize Performance, and Provide Application Flexibility," 1 page, released Jul. 13, 2009.

Honeywell HSC Series Data Sheets, "High Accuracy Pressure Sensors, 1 PSI to 150 PSI, SIP, Digital Output," 11 pages, released Jul. 13, 2009.

Honeywell HSC Series Data Sheets, "High Accuracy Pressure Sensors, 60 mbar to 10 bar, SMT and DIP, Analog Output," 11 pages, released Jul. 13, 2009.

Email Regarding the release date of items 3-5 cited on this IDS, 2 pages, email dated Nov. 15, 2010.

European Search Report for Corresponding Application EP 11176999.8-1236, dated Dec. 22, 2011.

* cited by examiner

PRESSURE SENSOR

FIELD

The present disclosure relates generally to pressure sensors, and more particularly, to pressure sensors for sensing pressure of a media.

BACKGROUND

Sensors, such as pressure and flow sensors, are often used to sense the pressure and/or flow of a media (e.g. gas or liquid) in a fluid channel. Such sensors are commonly used in a wide variety of applications including, for example, medical applications, flight control applications, industrial process applications, combustion control applications, weather monitoring applications, water metering applications, as well as many other applications.

SUMMARY

The present disclosure relates generally to pressure sensors, and more particularly, to pressure sensors for sensing a pressure of a media such as a gas or a liquid. In some embodiments, certain sensor features can help isolate the sensor and/or sensor components from media in harsh environments, such as environments in which the media can freeze. In one illustrative embodiment, a pressure sensor may include a substrate having a first side and a second side. A pressure sensing die may be mounted on the first side of the substrate with, for example, an adhesive, solder or other attachment mechanism. In some cases, a first housing member is positioned on the first side of the substrate, and may define a first cavity around the pressure sensing die. In some cases, a second housing member may be positioned on the second side of the substrate, and may define a second cavity. A passivating agent, such as a gel, can be positioned in one or both of the first cavity and the second cavity. The passivating agent may be configured to transmit pressure from a media to a pressure sensing element (e.g. diaphragm) of the pressure sensing die, while isolating the pressure sensing element (e.g. diaphragm) and/or other electronics or components of the pressure sensor from the media. In some cases, the passivating agent in the second cavity, when present, may have a non-uniform thickness and/or may be thinner than the passivating agent in the first cavity, but this is not required.

In some cases, an opening in the first housing member and/or the second housing member may be defined by one or more tapered and/or chamfered edges that are angled away from an axis extending perpendicular to the substrate. The one or more tapered and/or chamfered edges may help provide freeze damage protection to the pressure sensor by, for example, providing a relief so that when a freezing media expands, the freezing media is directed away from the pressure sensor.

In another illustrative embodiment, a method of manufacturing a pressure sensor is disclosed. The method may include, for example, mounting a pressure sensing die on a first side of a substrate, mounting a first housing member on the first side of the substrate to form a first cavity around the pressure sensing die, and mounting a second housing member on the second side of the substrate to form a second cavity. The first housing member and the second housing member may each include a pressure opening defined by one or more edges of the respective housing member. The method may further include filling at least a portion of the first cavity with a first gel and filling at least a portion of the second cavity with a second gel. In some cases, the first and second gel may be configured to transmit pressure from a media to be sensed to a pressure sensing element of the pressure sensing die.

The preceding summary is provided to facilitate a general understanding of some of the innovative features of the present disclosure, and is not intended to be a full description. A full appreciation of the disclosure can be gained by taking the entire specification, claims, drawings, and abstract as a whole.

BRIEF DESCRIPTION

The disclosure may be more completely understood in consideration of the following detailed description of various illustrative embodiments of the disclosure in connection with the accompanying drawings, in which.

DESCRIPTION

Figure 1:
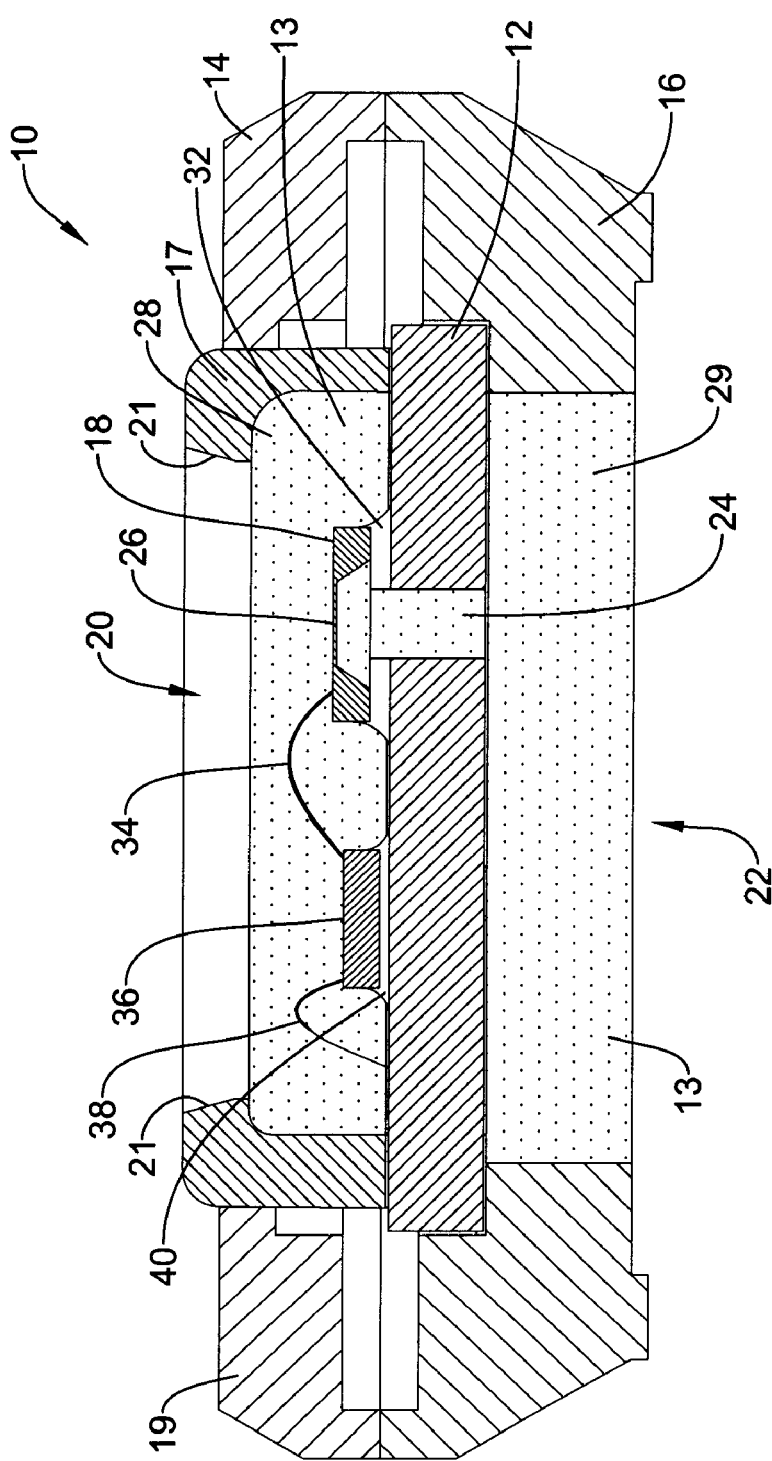
FIG. 1 is a cross-sectional view of an illustrative embodiment of a pressure sensor.

The following description should be read with reference to the drawings wherein like reference numerals indicate like elements throughout the several views. The description and drawings show several embodiments which are meant to be illustrative in nature.

FIG. 1 is a cross-sectional view of an illustrative pressure sensor 10 having enhanced media compatibility. In the illustrate embodiment, pressure sensor 10 includes a passivating agent 13 or other coating for isolating the electrical and/or other components of the pressure sensor 10 from a media, such as a liquid media, while still transmitting pressure to the pressure sensor 10. In some embodiments, the passivating agent 13 may be impervious to the media to help prevent corrosion and/or other undesirable effects on the sensor components. An example passivating agent 13 can include a gel, such as a flourosilicone gel. However, other suitable gels or passivating agents may be used, as desired.

As shown in FIG. 1, the pressure sensor 10 includes a pressure sensing die 18 mounted on a package substrate 12. In the illustrative embodiment, the pressure sensing die 18 may be a micromechanical sensor element fabricated using a silicon wafer and suitable fabrication techniques. The pressure sensing die 18 may have one or more pressure sensing elements and/or other circuitry (e.g. trim circuitry, signal conditioning circuitry, etc.) formed using suitable fabrication or printing techniques. In some cases, the pressure sensing die 18 may include a pressure sensing diaphragm 26 including one or more sensing elements, such as piezoresistive sensing components, formed thereon for sensing a deflection and thus a pressure differential between a top and bottom side of the pressure sensing diaphragm 26. In some cases, the pressure sensing diaphragm 26 may be fabricated by back-side etching a silicon die, however, any suitable process may be used, as desired.

When provided, the piezoresistive components may be configured to have an electrical resistance that varies according to an applied mechanical stress (e.g. pressure sensing diaphragm 26 deflection). In some cases, the piezoresistive components may include a silicon piezoresistive material, however, other non-silicon materials may be used. In some cases, the piezoresistive components may be connected in a Wheatstone bridge configuration (full or half bridge). It is to be understood that the piezoresistive components are only one example of a pressure sensing element that can be used, and it is contemplated that any other suitable sensing elements may be used, as desired.

In some embodiments, such as the illustrative embodiment shown in FIG. 1, the pressure sensor 10 may include optional signal conditioning circuitry 36 mounted on substrate 12. In some cases, the signal conditioning circuitry may include an ASIC (Application Specific Integrated Circuit) or other electronics. In some cases, the optional signal conditioning circuitry 36 may include amplification, analog-to-digital conversion, offset compensation circuitry, and/or other suitable signal conditioning electronics. When so provided, the signal conditioning circuitry 36 may receive a signal from the pressure sensing die 18, and condition and/or process the signal for transmission from the pressure sensor 10. While an ASIC die is shown, it is contemplated that signal conditioning circuitry 36 may include any suitable signal conditioning circuitry including any suitable microprocessor or microcontroller, as desired.

In some cases, signal conditioning circuitry 36 may be mounted to the package substrate 12 using an adhesive 40 or any other suitable bonding mechanism (e.g. solder, eutectic, etc.). As shown, signal conditioning circuitry 36 may be secured to the package substrate 12 adjacent to the pressure sense die 18, and may be electrically connected to pressure sensing die 18 via direct die-to-die wire bonds, but this is not required. As shown in FIG. 1, pressure sensing die 18 may be connected to signal conditioning circuitry 36 via wire bond 34, and signal conditioning circuitry 36 may be connected to trace conductors on the package substrate 12 via bond wires 38. Trace conductors may be connected to connectors, leads or terminals (shown as 30 in FIG. 2) of the pressure sensor 10.

In the illustrative embodiment, the package substrate 12 may include a ceramic material, however, it is contemplated that other suitable materials may be used as desired. In some cases, the pressure sensing die 18 may be mounted to the substrate 12 using an adhesive 32 such as a silicone, RTV, a silicone-epoxy, a soft epoxy, or a regular or hard epoxy. In some cases, the adhesive 32 may have a thickness providing mechanical stress isolation between the pressure sensing die 18 and the package substrate 12 such that the pressure sensing die 18 is effectively unconstrained relative to the package substrate 12. In some cases, the thickness of adhesive 32 may be thick enough for adequate adherence of pressure sense die 18 to substrate 12, but not so thick so as to interfere with the bonding or diaphragm of pressure sense die 18. In other cases, the pressure sensing die 18 may be mounted to the substrate 12 using any other suitable bonding mechanism (e.g. solder, eutectic, etc.).

In some instances, an alumina based ceramic package substrate 12 may be used, and a pressure sensing die 18 may be directly attached or glued to the package substrate 12, sometimes using an RTV, silicone, epoxy, or other suitable adhesive. In some instances, no intervening isolation layers or substrates are provided between the pressure sensing die 18 and the package substrate 12, but this is not required. Thermal and mechanical stresses may be minimized by careful design of the entire package. The ceramic substrate 12 itself may be thick relative to its surface area to help improve stability. In some embodiments, the pressure sensing die 18 may include a silicon material, and the package substrate 12 may include an alumina ceramic, which may have similar temperature expansion coefficients. The pressure sensing die 18 and package substrate 12, however, may be made of materials other than those stated herein. Additionally, it is contemplated that an isolation layer or glass substrate may be provided in pressure sensor 10, if desired.

In some cases, the pressure sensing die 18 may be mounted over an opening 24 in the package substrate 12 that is sized to expose the back side of the pressure sensing diaphragm 26 to the bottom side of the package substrate 12. In this instance, a pressure applied to the back side of pressure sensor 10 may be transmitted to the back side of pressure sensing diaphragm 26 via passivating agent 13 and opening 24.

In the illustrative embodiment, a protective housing of the pressure sensor 10 may be provided. The protective housing may include a top protective cover 14 defining a cavity 28 for the pressure sensing die 18 and a bottom protective cover 16 defining cavity 29. As illustrated, the top protective cover 14 is disposed on a top side of the substrate 12. The bottom protective cover 16 is disposed on a bottom side of the substrate 12. With such a configuration, the top and bottom protective covers 14 and 16 may help protect the pressure sensing element of pressure die 18. In some cases, the top protective cover 14 and the bottom protective cover 16 may be formed from, for example, plastic, polyamide, ceramic, or any other suitable material. In some cases, these covers may be attached to the substrate with the same or substantially the same "footprint" on each side, but this is not required.

In the illustrative embodiment shown in FIG. 1, the top protective cover 14 may includes an inner housing member 17 and an outer housing member 19, but this is not required. The inner housing member 17 may include a top wall and one or more side walls defining a cavity 28 for housing the pressure sensing die 18. The top wall of the inner housing member 17 may define a pressure opening 20 for exposing the pressure sensing element (e.g. top side of pressure sensing diaphragm 26) to a first input pressure of a media. The inner housing member 17 may be attached to the package substrate 12 using a suitable adhesive or any other suitable bonding mechanism (e.g. solder, eutectic, etc.). In some cases, the inner housing member 17 may be attached to the package substrate 12, and then the outer housing member 19 may be mounted over the assembled inner housing member 17 and packaged substrate 12. In other instances, it is contemplated that the inner housing member 17 and the outer housing member 19 may be attached to the package substrate 12 at the same time. While the inner housing member 17 and the outer housing member 19 are shown as separate members, it is contemplated that inner housing member 17 and outer housing member 19 may form a single part, if desired. In some cases, the outer housing member 19 may not be provided at all.

In the illustrative embodiment of FIG. 1, the bottom protective cover 16 may define a cavity 29 and may also include a pressure opening 22 for exposing the pressure sensing element (e.g. bottom side of pressure sensing diaphragm 26) to a second input pressure. The bottom protective cover 16 may include a single part, but this is not required. In some cases, the bottom protective cover 16 may include an inner housing member and an outer housing member similar to the top protective cover 14 as discussed above.

In FIG. 1, the pressure sensing element may be configured to sense a pressure differential between the pressure opening 20 and the pressure opening 22. A signal corresponding to the sensed pressure difference may be transmitted to an optional signal conditioning circuitry 36 for conditioning. While the foregoing pressure sensor 10 is shown as a differential or gauge pressure sensor, it is contemplated that the housing may only include one of openings 20 and 22 for absolute or vacuum pressure sensor applications, as desired.

In some embodiments, the inner housing member 17 may include one or more tapered and/or chamfered edges 21 that define pressure opening 20. The one or more tapered and/or chamfered edges 21 may be angled away from an axis extending perpendicular to the substrate 12, as shown. In this configuration, the one or more tapered and/or chamfered edges 21 may help provide freeze damage protection to the pressure sensor 10 by, for example, providing a relief so that when a freezing media expands, the freezing media is directed away from the pressure sensor. Said another way, tapered and/or chamfered edges 21 may cause a freezing media to expand out of the pressure sensor 10. As shown in FIG. 1, only the top protective cover 14 includes the tapered and/or chamfered edges 21, however, bottom protective cover 16 may also include tapered and/or chamfered edges, if desired.

In the illustrative embodiment, cavity 28 and/or cavity 29 may be at least partially filled with a passivating agent 13 or coating, which may include a gel or other passivating agent. In some cases, the passivating agent 13 may include an incompressible material to transmit pressures from openings 20 and 22 to the pressure sensing diaphragm 26. As shown in FIG. 1, both cavities 28 and 29 may be filled with passivating agent 13, however, as discussed above, it is contemplated that only one of cavities 28 or 29 may be at least partially filled with the passivating agent 13, if desired. In some cases, opening 24 and the back side of pressure sensing die 18 may be filled with passivating agent 13, if desired.

In some cases, the passivating agent 13 may help isolate the pressure sensing die 18, signal conditioning circuitry 36, and/or other electronics from a sensed media. Example passivating agents may include gels, such as a flourosilicone gel. Some example gels include Sylgard® 527 and TSE 118, which are available from Dow Corning Corporation. In some cases, the top side and bottom side of pressure sensor 10 may be filled with different passivating agents 13 or gels. For example, cavity 28 may be filled with a first gel, such as Sylgard® 527, and cavity 29 may be filled with a second gel, such as TSE 118. In some cases, filling both cavities 28 and 29 of pressure sensor 10 with the same passivating agent 13 with the same thickness may help stabilize the pressure sensor 10 for age (e.g. drift), help equalize and cancel out the stress caused by the passivating agent 13 at the sensing element, and/or help reduce temperature (e.g. thermal expansion) induced variations in the sensor.

Figure 1A:
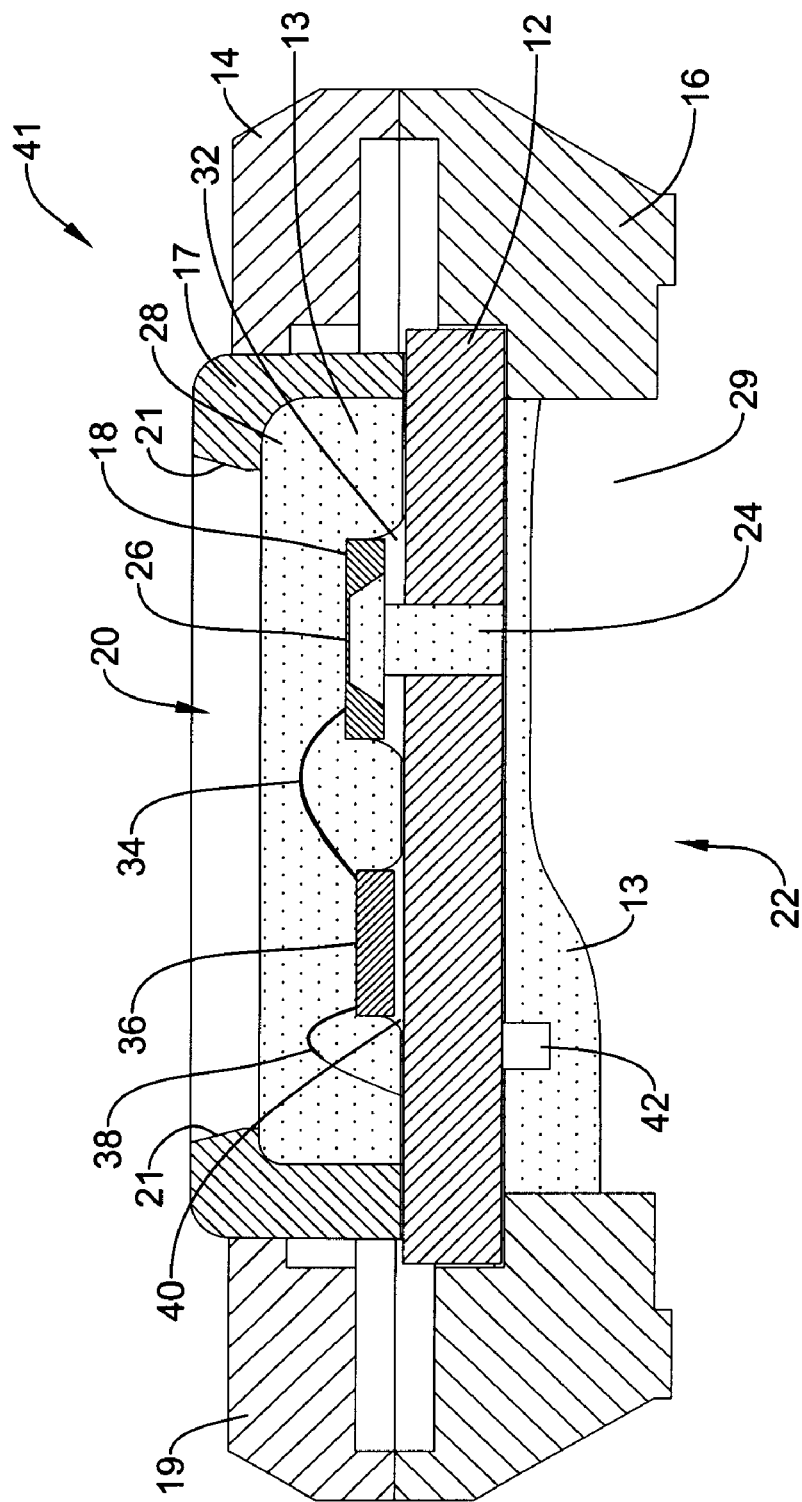
FIG. 1A is a cross-sectional view of an illustrative embodiment of another pressure sensor.

In some cases, the passivating agent 13 may be filled in cavities 28 and 29 with a thickness in the range of 0.1 to 5 millimeters. The cavities 28 and 29 may be filled with the same or different thicknesses of a passivating agent 13. For example, cavity 28 of the top protective cover 14 may be filled with a passivating agent 13 having a thickness in the range of about 1 to about 2 millimeters, and cavity 29 may be filled with a passivating agent 13 having a thickness in the range of about 0.1 to about 1 millimeter. Further, it is contemplated that cavities 28 and/or 29 may have varying thicknesses of passivating agents 13. For example, as shown in FIG. 1A, pressure sensor 41 may have a capacitor 42 or other electrical components mounted on a back side of package substrate 12. The passivating agent 13 may have a greater thickness around the capacitor 42 or other electrical components than over opening 24. In some cases, the passivating agent 13 may have a thickness in the range of about 0.1 to about 0.25 millimeters over the opening 24 and a thickness in the range of about 0.25 to about 1.0 millimeters over the capacitor 42. However, it is contemplated that any suitable thickness may be used for passivating agent 13, as desired.

In the illustrative embodiment, the passivating agent 13 may be filled and/or processed to reduce air and/or bubbles from being trapped in passivating agent 13 within the cavities 28 and 29. Example procedures to reduce air and/or bubbles may include filling the cavities 28 and 29 with the passivating agent 13 under a vacuum, pulling a vacuum on the passivating agent 13 prior to curing, curing the passivating agent 13 under a vacuum (e.g. outgas during curing), and/or using any other suitable procedure, as desired.

In operation, a first pressure may be applied to passivating agent 13 in opening 20 defined by top cover 14, which is transmitted to a first side of the pressure sensing diaphragm 26 via cavity 28. A second pressure may be applied to passivating agent 13 in opening 22 defined by bottom cover 16, which is transmitted through cavity 29 to a second side of the pressure sensing diaphragm 26. A pressure difference between the first pressure and second pressure can cause a deflection of pressure sensing diaphragm 26, which may then stress one or more piezoresistive elements on the pressure sensing diaphragm 26. Applying a current through the piezoresistive elements may provide a signal that corresponds to the pressure difference between the first pressure and the second pressure. In some cases, the resulting signal may be conditioned by conditioning circuitry 36 and output via electrical leads 30 (shown in FIG. 2).

As shown in FIG. 1, the passivating agent 13 may be provided on both sides of the pressure sensor 10, but this is not required. It is contemplated that in other embodiments, the passivating agent 13 may be provided on only one side of the pressure sensor 10, such as the top or bottom side, if desired. For example, the passivating agent 13 may be provided on the top side of the pressure sensor 10 while leaving the back side of the pressure sensor exposed to the media.

In the illustrative embodiment of FIG. 1, the pressure sensing element is a differential pressure sensing element. However, it is contemplated that other types such as non-differential pressure sensing elements may be used, as desired. For example, the pressure sensing element may be an absolute pressure sensing element or a gauge pressure sensing element. An absolute pressure sensing element may have an internal vacuum (or other) reference pressure, and a gauge pressure sensing element may reference atmospheric pressure.

Figure 2:
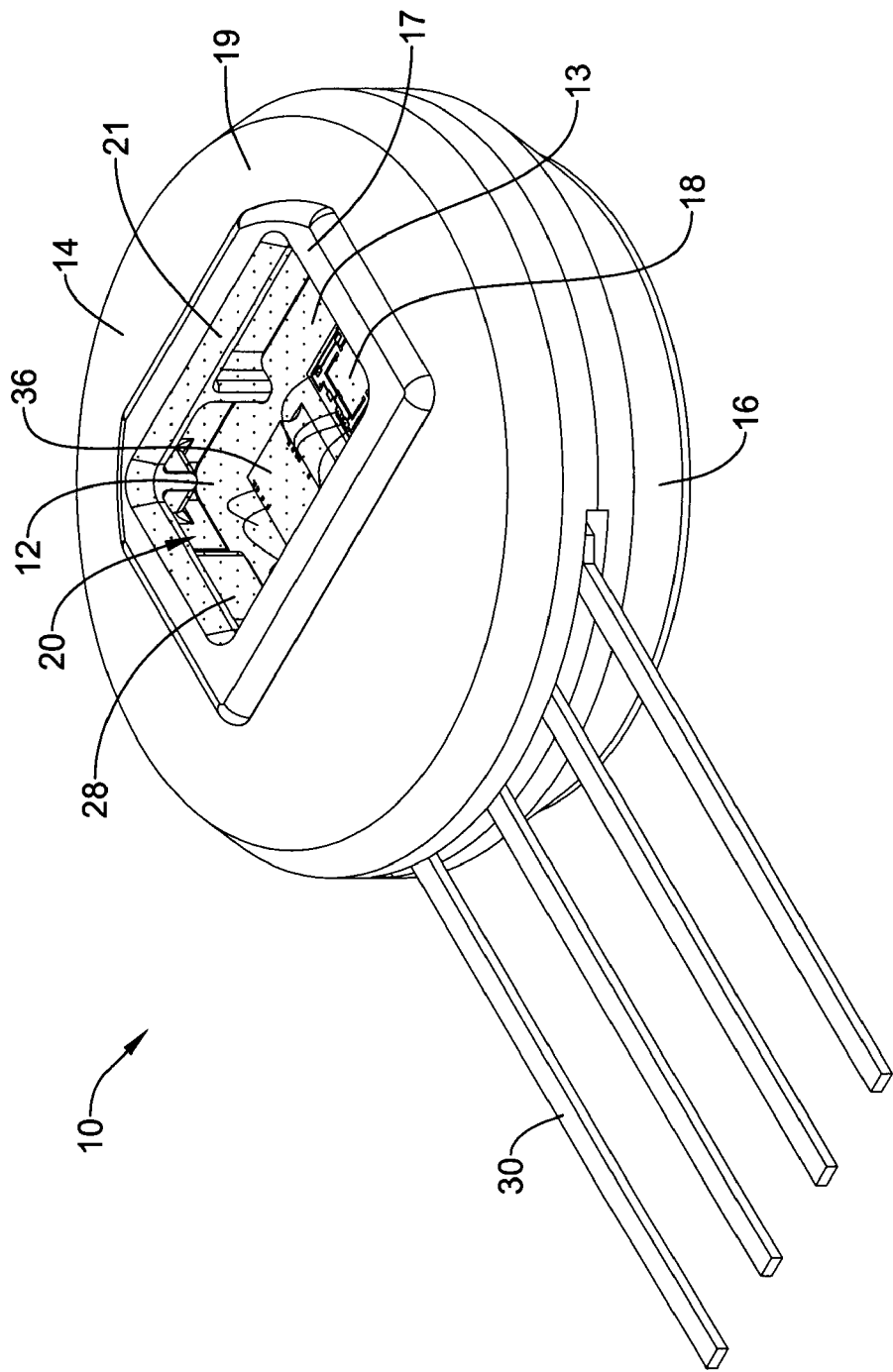
FIGS. 2 and 3 are top and bottom perspective views of the illustrative pressure sensor shown in FIG. 1.
Figure 3:
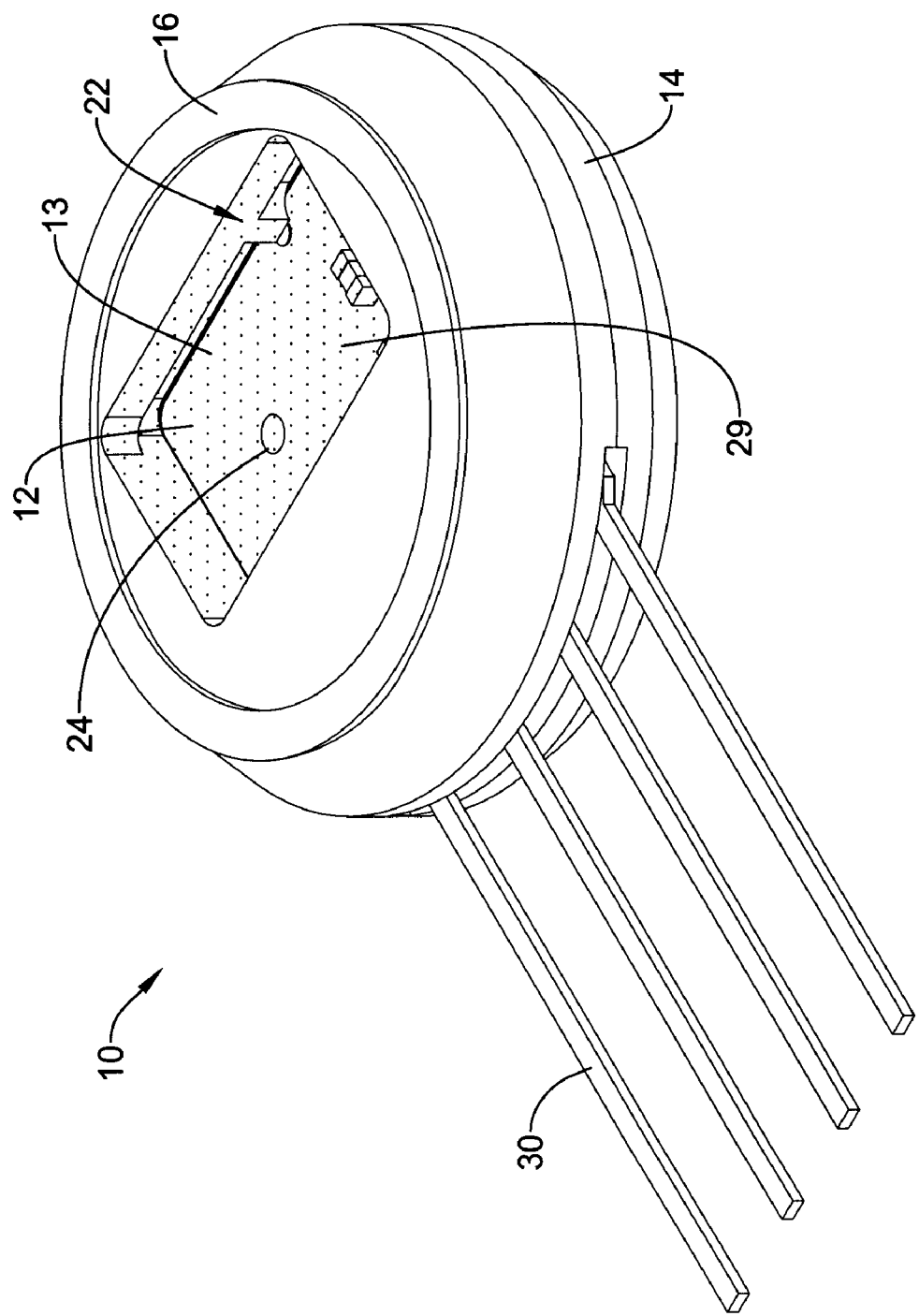

FIGS. 2 and 3 are top and bottom perspective views of the illustrative pressure sensor 10. As shown, pressure sensor 10 may include an outer protective housing including a top protective cover 14 and a bottom protective cover 16. As illustrated, the top protective cover 14 is disposed on a top side of the substrate 12 to help protect the pressure sensing die 18 and signal conditioning circuitry 36 that may be positioned on the top side of the substrate 12. The bottom protective cover 16 is disposed on a bottom side of the substrate 12 to protect the bottom side of the substrate 12. In some cases, the top protective cover 14 and the bottom protective cover 16 may be formed from, for example, plastic. However, it is contemplated that any other suitable material may be used, as desired.

In the illustrative embodiment of FIG. 2, the top protective cover 14 includes outer housing member 19 and inner housing member 17. The inner housing member 17 defines a cavity 28 and a pressure opening 20 for exposing the pressure sensing element (e.g. pressure sensing diaphragm 26) to a first pressure (see also FIG. 1A). Cavity 28 may be at least partially filled with passivating agent 13, or gel, to transmit the pressure from the pressure opening 20 to the top side of the pressure sensing element (e.g. pressure sensing diaphragm 26). As illustrated in FIG. 3, the bottom protective cover 16 may define a cavity 29 and a pressure opening 22 for exposing the pressure sensing element (e.g. pressure sensing diaphragm 26) to a second pressure. Cavity 29 defined by the bottom protective cover 16 may be at least partially filled with passivating agent 13, or gel, to transmit the pressure from the pressure opening 22 to the bottom side of pressure sensing element (e.g. pressure sensing diaphragm 26) via opening 24. The pressure sensing element (e.g. pressure sensing diaphragm 26) may be configured to sense a pressure differential across pressure opening 20 and pressure opening 22. A signal corresponding to the sensed pressure difference may, in some cases, be transmitted to signal conditioning circuitry 36 for conditioning.

In the illustrative embodiment of FIG. 2, the pressure sensor assembly 10 may include one or more electrical leads 30 mounted to the substrate 12 and electrically connected to the signal conditioning circuitry 36 for receiving a conditioned signal corresponding to the pressure sensed by the sensing element. In some cases, the one or more electrical leads 30 may include a metal, however, any suitable material may be used, as desired.

Figure 4:
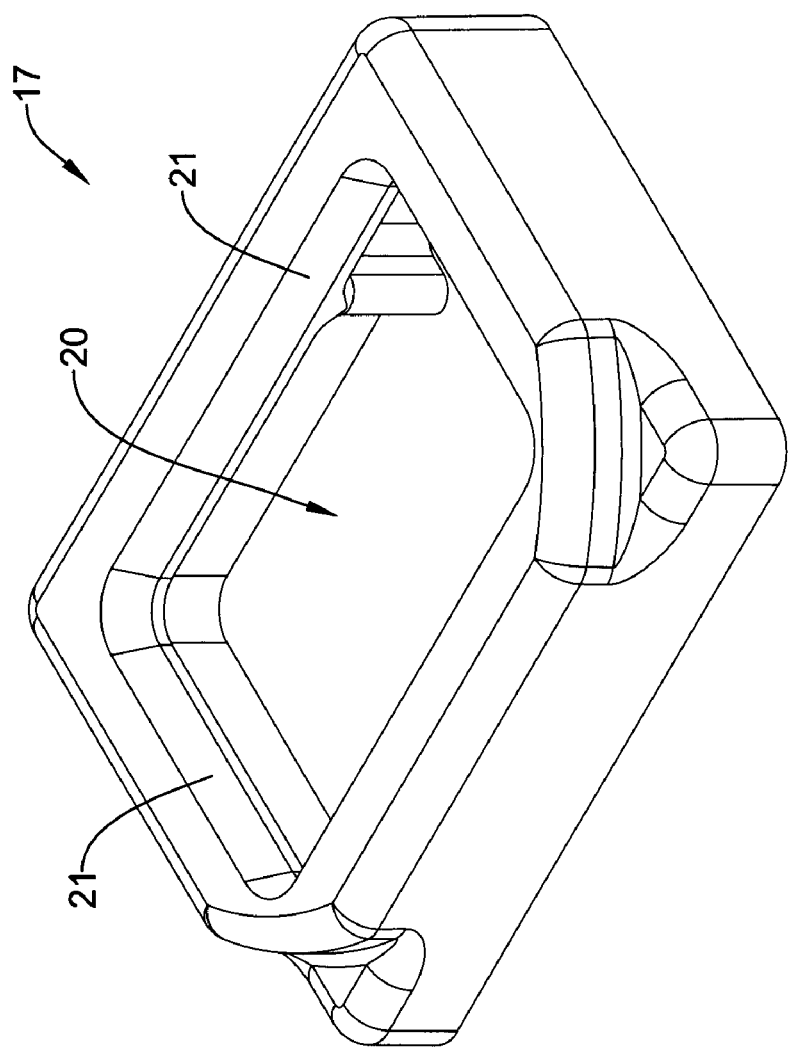
FIGS. 4 and 5 are top and bottom perspective views of an inner housing member of the top protective cover shown in FIGS. 1 and 2.
Figure 5:
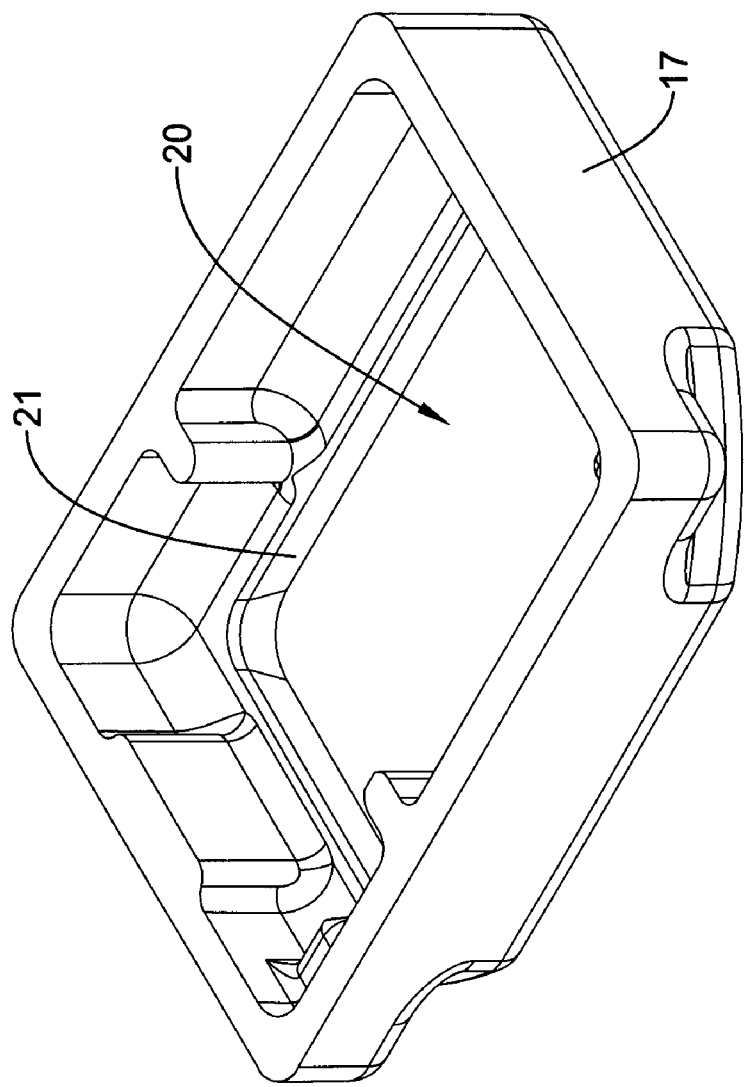

FIGS. 4 and 5 are top and bottom perspective views of the inner housing member 17 shown in FIGS. 1 and 2. In the illustrative embodiment, the inner housing member 17 may include a top wall and one or more side walls. The top wall may include opening 20 defined by one or more edges 21. As illustrated, edges 21 may be tapered and/or chamfered such that the top side of opening 20 is larger than the bottom side of opening 20. In some cases, the tapered and/or chamfered edges 21 may be generally ice cube tray shaped such that if a liquid media in contact with the passivating agent 13 freezes and expands, the media expands out of the opening 20 and not toward the substrate. In some cases, the walls of the inner housing member 17 may be relatively thin to help absorb the thermal expansion.

In the illustrative embodiment, the one or more side walls may include an inner surface defining cavity 28 for housing the pressure sensing die 18, optional signal conditioning circuitry 36, and any other suitable electronics, as desired. As discussed above, cavity 28 may be at least partially filled with a passivating agent 13 or gel when assembled on substrate 12. In some embodiments, to reduce air or other bubbles from being trapped within the passivating agent or gel, the side walls may be chamfered or rounded to aid in releasing air from the cavity.

FIGS. 6-10 are top perspective views of illustrative pressure sensors including alternative inner housing members. As shown in the illustrative embodiments, the inner housing members may include a top wall having one or more openings for exposing the passivating agent 13 to media pressure and/or for filling the top cavity (shown as cavity 28 in FIG. 1) with the passivating agent 13. In some instances, the top wall may be formed to help protect the passivating agent 13 from being damaged when handled by a user or from other objects that may contact the top of the pressure sensor.

Figure 6:
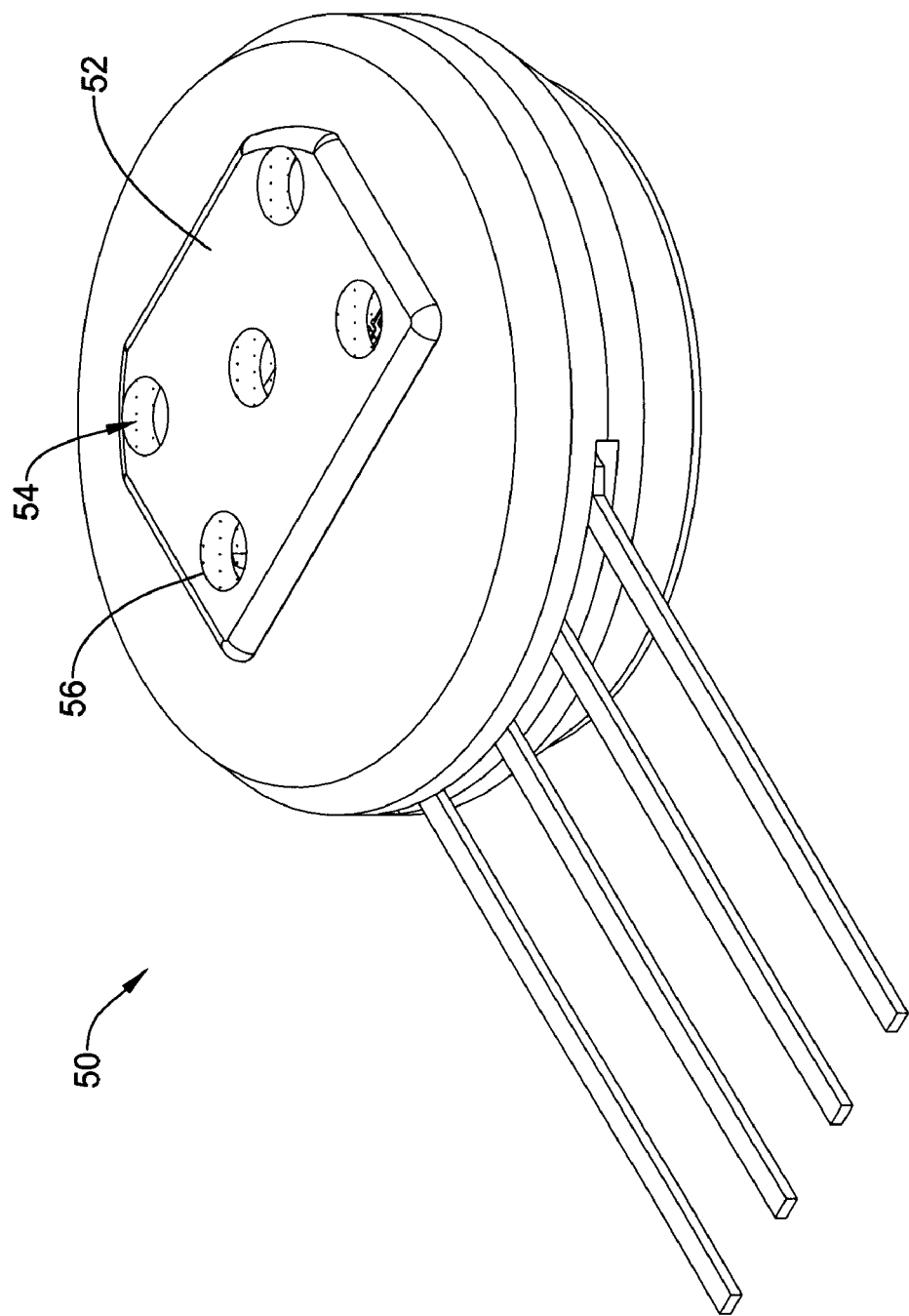
FIGS. 6-10 are top perspective views of illustrative embodiments of pressure sensors including alternate inner housing members.

As shown in FIG. 6, pressure sensor 50 may include an inner housing member 52 having multiple small openings 54 (relative to opening 20 shown in FIG. 2) defined by one or more edges 56. In the illustrative example, inner housing member 52 includes five openings, however, it is contemplated that more openings or fewer openings may be provided, as desired. Openings 54 may be configured to allow passivating agent 13 to still sufficiently transmit pressure to pressure sensing element (e.g. pressure sensing diaphragm 26), but may also provide increased protection to passivating agent 13. While edges 56 are not shown as being tapered or chamfered, it is contemplated that edges may be tapered and/or chamfered to help provide freeze damage protection, as described above.

Figure 7:
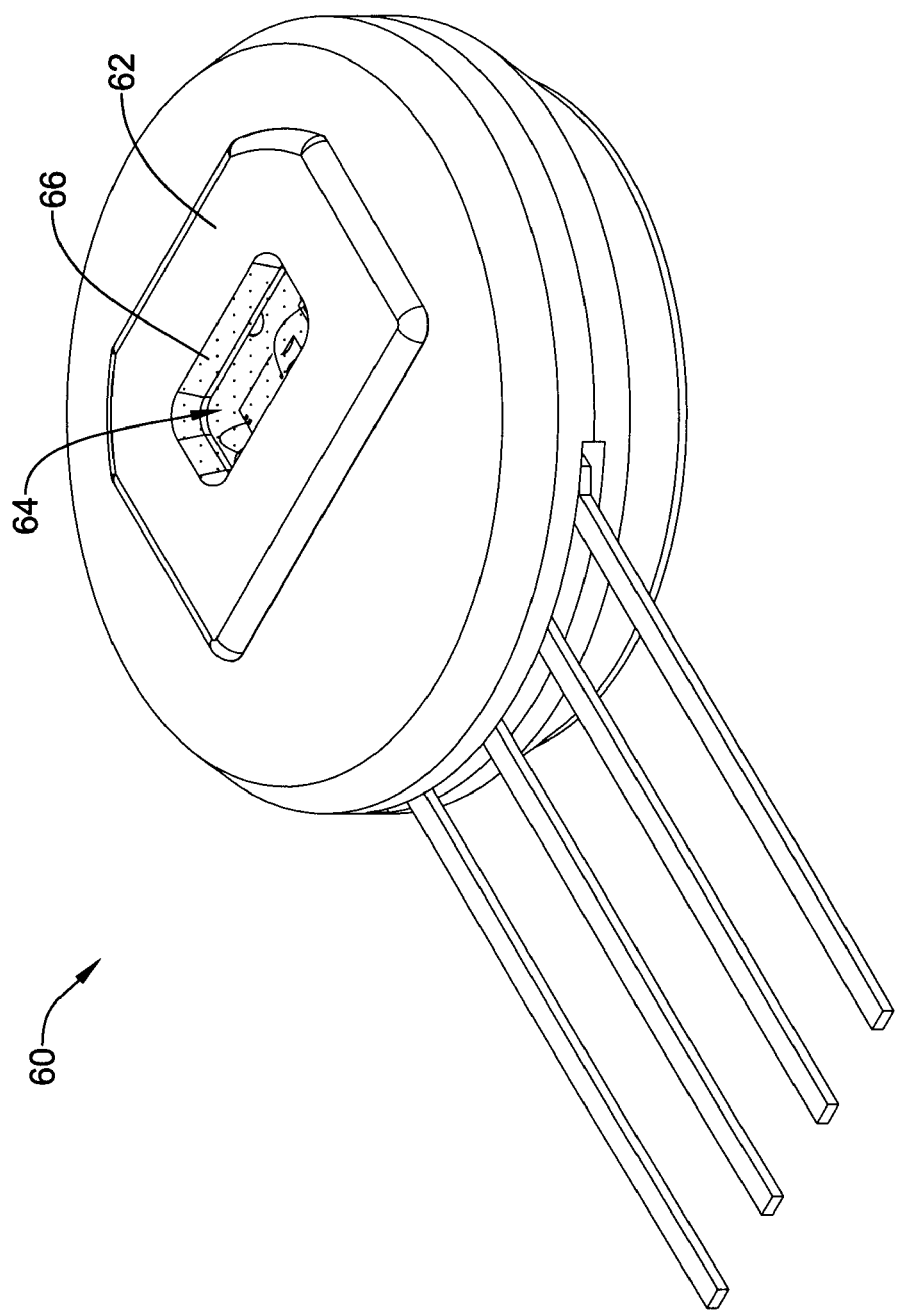

FIG. 7 shows another illustrative pressure sensor 60 including an inner housing member 62 having an opening 54 defined by one or more edges 66. As shown, opening 64 may be similar in shape to opening 20 shown in FIG. 2, except opening 64 is smaller. Opening 64 may still allow passivating agent 13 to sufficiently transmit pressure to pressure sensing element (e.g. pressure sensing diaphragm 26), while providing increased protection to passivating agent 13. As shown, edges 66 are tapered and/or chamfered to provide freeze protection, but this is not required.

Figure 8:
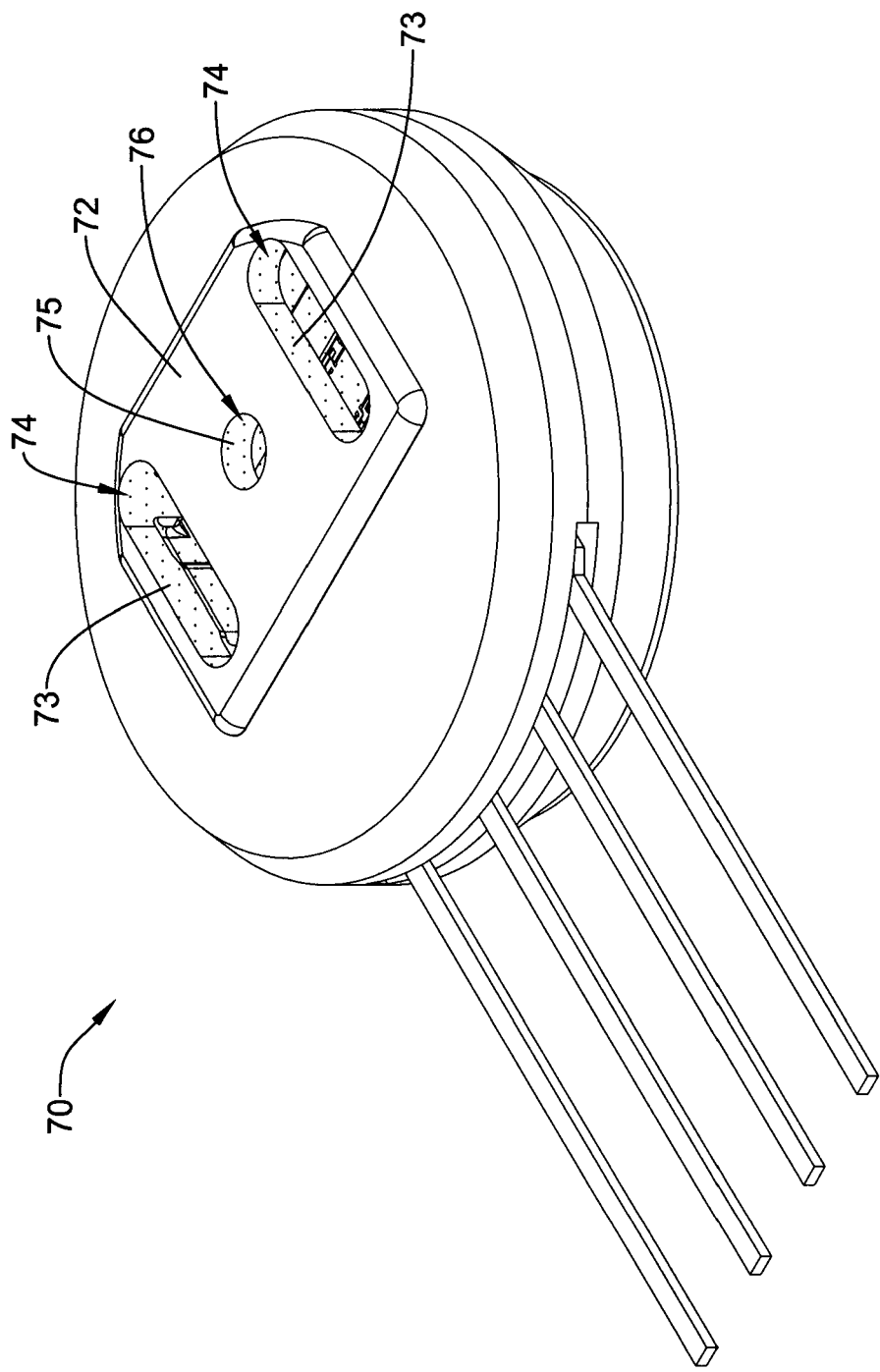

FIG. 8 shows another illustrative pressure sensor 70 including an inner housing member 72 having multiple openings 74 and 76. As shown, inner housing member 72 may include a pair of openings 74 defined by edges 73 and a central opening 76 defined by edges 75. Openings 74 may be generally oval in shape and opening 76 may be generally circular in shape. However, it is contemplated that openings 74 and 76 may be other shapes, such as, for example, rectangular shapes. In any event, openings 74 and 76 may still allow passivating agent 13 to sufficiently transmit pressure to pressure sensing element (e.g. pressure sensing diaphragm 26), while providing increased protection to passivating agent 13. While edges 73 and 75 are not shown as being tapered or chamfered, it is contemplated that edges may be tapered and/or chamfered, as desired.

Figure 9:
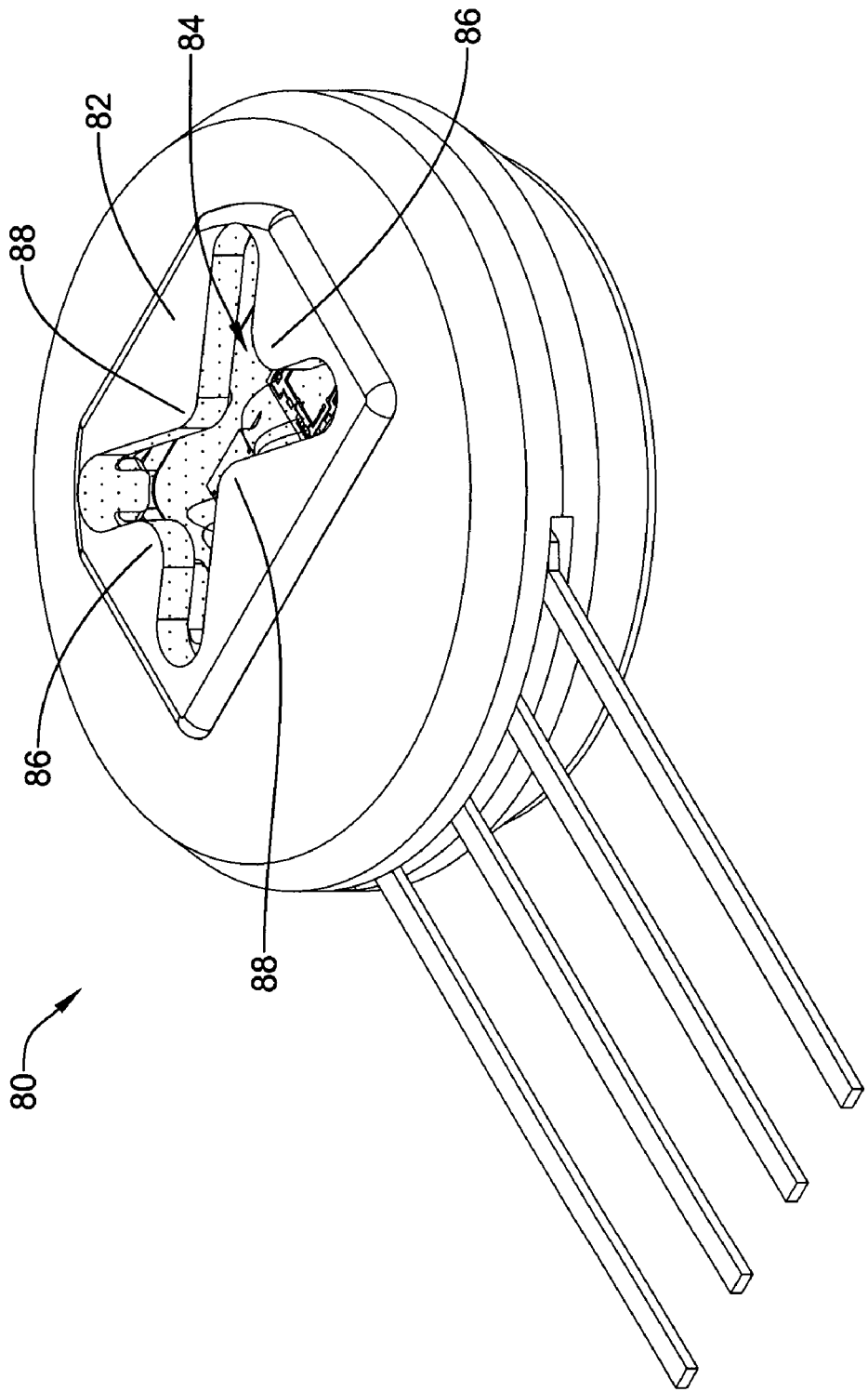
Figure 10:
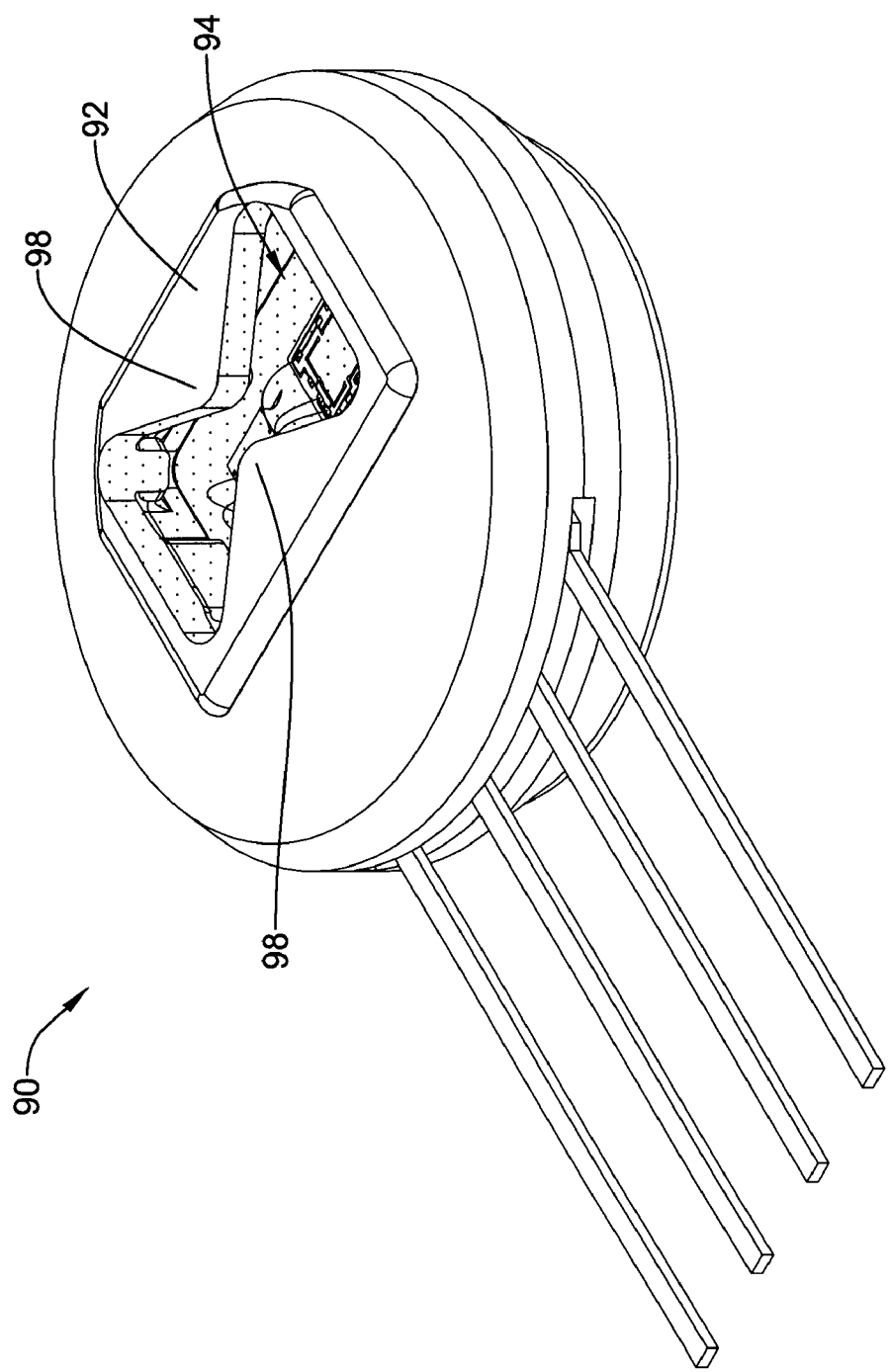

FIGS. 9 and 10 show other illustrative pressure sensors 80 and 90 including inner housing members 82 and 92, respectively. As shown, inner housing members 82 and 92 may be similar to inner housing member 17, but may each include a pair of opposing wings 88 and 98 extending into openings 84 and 94 reducing the size of the openings. Inner housing member 82, shown in FIG. 9, may also include opposing wings 86 extending into opening 84 to further reduce the size of opening 84, if desired. Openings 84 and 94 may still allow passivating agent 13 to sufficiently transmit pressure to pressure sensing element (e.g. pressure sensing diaphragm 26), while providing increased protection to passivating agent 13. While openings 84 and 94 are not shown as including tapered or chamfered edges, it is contemplated that edges may be tapered and/or chamfered, as desired.

Further, while openings 54, 64, 74, 76, 84 and 94 are shown as being formed in the top protective cover 14, it is contemplated that the bottom protective cover 16 may include similar openings, as desired.

Having thus described the preferred embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:
1. A pressure sensor comprising:
a substrate including a first side and a second side, the substrate including an opening extending between the first side and the second side;
a pressure sensing die mounted directly on the first side of the substrate with an adhesive, wherein the pressure sensing die includes a diaphragm and one or more piezoresistive elements positioned on the diaphragm, wherein the pressure sensing die is positioned over the opening;

a first housing member positioned on the first side of the substrate and defining a first cavity around the pressure sensing die, wherein the first housing member includes a first pressure opening defined by one or more first edges of the first housing member, wherein the one or more first edges are tapered and/or chamfered;

a first flourosilicone gel positioned in the first cavity to cover at least part of the pressure sensing die and at least part of the first side of the substrate;

a second housing member positioned on the second side of the substrate and defining a second cavity, wherein the second housing member includes a second pressure opening defined by one or more second edges of the second housing member; and a second flourosilicone gel positioned in the second cavity to cover at least part of the second side of the substrate.

2. A pressure sensor comprising:

a substrate including a first side and a second side, the substrate including an opening extending between the first side and the second side;

a pressure sensing die mounted directly on the first side of the substrate with an adhesive, wherein the pressure sensing die includes a diaphragm and one or more piezoresistive elements positioned on the diaphragm, wherein the pressure sensing die is positioned over the opening;

a first housing member positioned on the first side of the substrate and defining a first cavity around the pressure sensing die, wherein the first housing member includes a first pressure opening defined by one or more first edges of the first housing member;

a first passivating agent positioned in the first cavity to cover at least part of the pressure sensing die and at least part of the first side of the substrate;

a second housing member positioned on the second side of the substrate and defining a second cavity, wherein the second housing member includes a second pressure opening defined by one or more second edges of the second housing member; and a second passivating agent positioned in the second cavity to cover at least part of the second side of the substrate.

3. The pressure sensor of claim 2, wherein the first passivating agent in the first cavity is configured to transmit pressure from the first pressure opening to a top side of the diaphragm and, wherein the second passivating agent in the second cavity is configured to transmit pressure from the second pressure opening to a bottom side of the diaphragm via the opening in the substrate.

4. The pressure sensor of claim 2, wherein the first passivating agent has a first thickness in the first cavity and the second passivating agent has a second thickness in the second cavity, wherein the second thickness is less than the first thickness.

5. The pressure sensor of claim 2, wherein the second passivating agent has a non-uniform thickness in the second cavity.

6. The pressure sensor of claim 2, wherein the substrate includes a ceramic material.

7. The pressure sensor of claim 2, wherein the adhesive for mounting the pressure sensing die to the first side of the substrate is RTV.

8. The pressure sensor of claim 2, further comprising signal conditioning circuitry mounted on the first side of the substrate in electrical communication with the pressure sensing die, wherein the signal conditioning circuitry is configured receive a signal from the pressure sensing die and condition the signal to provide a conditioned output signal from the pressure sensor.

9. The pressure sensor of claim 2, wherein the first and second passivating agents includes a gel.

10. The pressure sensor of claim 9, wherein the gel includes a flourosilicone gel.

11. The pressure sensor of claim 9, wherein a first gel is disposed in the first cavity and a second gel is disposed in the second cavity, wherein the first gel and the second gel are different.

12. The pressure sensor of claim 2, wherein the one or more first edges are tapered and/or chamfered.

13. A pressure sensor comprising:

a substrate including a first side and a second side;

a pressure sensing element mounted on the first side of the substrate;

a first housing member positioned on the first side of the substrate and defining a first cavity around the pressure sensing element, wherein the first housing member includes a first pressure opening defined by one or more tapered and/or chamfered first edges; and a first passivating agent disposed in the first cavity covering at least part of the pressure sensing element, wherein the first passivating agent is configured to transmit a pressure of a first media at the first pressure opening to the pressure sensing element while isolating the pressure sensing element from the first media.

14. The pressure sensor of claim 13, further comprising:

a second housing positioned on the second side of the substrate and defining a second cavity to define a second chamber, the second housing including a second pressure opening; and a second passivating agent disposed in the second cavity, wherein the second passivating agent is configured to transmit a pressure of a second media at the second pressure opening to the pressure sensing element via an opening in the substrate while isolating the pressure sensing element from the second media.

15. The pressure sensor of claim 13, further comprising signal conditioning circuitry mounted on the first side of the substrate in electrical communication with the pressure sensing element, wherein the signal conditioning circuitry is configured receive a signal from the pressure sensing element and condition the signal to provide a conditioned output signal from the pressure sensor.

16. The pressure sensor of claim 14, wherein the first and second passivating agents include a flourosilicone gel.

17. A method of manufacturing a pressure sensor, the method comprising:

mounting a pressure sensing die on a first side of a substrate, wherein the pressure sensing die includes a pressure sensing diaphragm;

mounting a first housing member on the first side of the substrate to form a first cavity around the pressure sensing die, wherein the first housing member includes a first pressure opening defined by one or more first edges of the first housing member;

filling at least a portion of the first cavity with a first gel to cover at least part of the pressure sensing die;

mounting a second housing member on a second side of the substrate to form a second cavity, wherein the second housing member includes a second pressure opening defined by one or more second edges of the second housing member; and filling at least a portion of the second cavity with a second gel.

18. The method of claim 17, wherein the first gel is configured to transmit pressure from the first pressure opening to a top side of the pressure sensing diaphragm, and the second gel is configured to transmit pressure from the second pressure opening to a bottom side of the pressure sensing diaphragm via an opening in the substrate.

19. The method of claim 17, wherein the one or more first edges are tapered and/or chamfered.

20. The method of claim 17, wherein the first gel has a different thickness than the second gel.

21. The method of claim 17, wherein the second gel has a non-uniform thickness.

* * * * *